United States Patent [19]

Lewis et al.

[11] Patent Number: 5,700,979
[45] Date of Patent: Dec. 23, 1997

[54] FLEXIBLE STRIP CABLE WITH EXTENSION FOR TESTING

[75] Inventors: David E. Lewis, Black Forest; Kent T. Murphy, Colorado Springs, both of Colo.

[73] Assignee: Discovision Associates, Irvine, Calif.

[21] Appl. No.: 418,738

[22] Filed: Apr. 7, 1995

[51] Int. Cl.⁶ .................................................. H01B 7/08
[52] U.S. Cl. ............................ 174/117 F; 174/117 FF
[58] Field of Search ....................... 174/102 SP, 117 R, 174/117 F, 117 FF; 439/951, 492, 494, 912

[56] References Cited

U.S. PATENT DOCUMENTS

| | | | |
|---|---|---|---|
| 3,900,241 | 8/1975 | Fry | 439/492 X |
| 4,076,365 | 2/1978 | Ross et al. | 439/494 X |
| 4,353,372 | 10/1982 | Ayer | 174/117 FF X |

FOREIGN PATENT DOCUMENTS 1471928  4/1977  United Kingdom .

*Primary Examiner*—Hyung S. Sough
*Assistant Examiner*—Marc D. Machtinger

*Attorney, Agent, or Firm*—Ronald J. Clark; Robert T. Braun; Donald Bollella

[57] ABSTRACT

A flexible strip test cable is disclosed having an elongated flexible strip cable, a series of strip traces disposed lengthwise on the flexible strip cable and having electrical strip contacts near one end of the flexible strip cable, an extension cable integral with the flexible strip cable and having a width at one end greater than the width of the flexible strip cable, and a series of test traces on the extension cable having electrical test contacts near the end of the extension cable remote from the flexible strip cable. Each of the test traces is electrically connected to one of the strip traces, and the minimum distance between two test contacts is greater than the minimum distance between two strip contacts. The flexible strip test cable may have a tooling guide for aligning a cutting tool with the end of the flexible strip cable which is connected to the extension cable. Alternatively, the test contacts may be electrically accessible through one surface of the extension cable in any pattern such that the minimum distance between two test contacts is greater than the minimum distance between two strip contacts. In still another embodiment, at least one test contact is electrically accessible through one surface of the extension cable and at least one test contact is electrically accessible through the opposing surface of the extension cable.

19 Claims, 2 Drawing Sheets

FLEXIBLE STRIP CABLE WITH EXTENSION FOR TESTING

BACKGROUND OF THE INVENTION

1. Field of the Invention

This invention relates to the testing of electronic devices and, in particular, to the testing of electronic wiring carried on flexible strip cables.

2. Description of the Related Art

Flexible strip cables are used in electronic devices to carry electric signals. Flexible strip cables allow many traces to carry independent signals in a small space. The traces have electrical strip contacts which are accessible to a connector in the electronic device.

Testing of the flexible strip cables is required during manufacture to ensure that the traces function properly. However, the distance between each strip contact may be on the order of 0.5 mm. If a test probe is misaligned such that either no strip contact is probed, or such that more than one strip contact is probed, the flexible strip cable may be damaged or even ruined. Furthermore, misalignment of a test probe causes inaccurate test results.

Additionally, manufacturing processes may use signals through a flexible strip cable in the device being manufactured. For example, in one process for manufacturing a magneto-optical drive, an optics module flexible strip cable is aligned using electrical connections out of the flexible strip cable.

One prior attempt to perform this testing has been to attach a test connector to the traces on the flexible strip cable. Such a connection may be made at the strip contacts. This form of connection tests the entire length of the traces. However, test connectors with a lead spacing on the order of 0.5 mm may have a useful life of less than 50 connections and disconnections. By contrast, a small manufacturing facility may produce several hundred electronic devices per day, requiring a corresponding number of connections and disconnections. Therefore, test connectors wear out many times each day, increasing cost of production.

Another form of prior testing has been to attach another test cable or test probes to some point on the length of the flexible strip cable. The attachment point is not at the strip contacts on the flexible strip cable. Further, the test cable or test probes are permanently attached to the flexible strip cable, even in a final production model of the electronic device, adding to the size required by the flexible strip cable. Testing in this manner does not allow testing of the entire length of the traces.

SUMMARY OF THE INVENTION

According to the invention, an elongated flexible strip cable has a series of strip traces disposed lengthwise thereon. Each of the strip traces has electrical strip contacts near one end of the flexible strip cable. An extension cable is integral with the flexible strip cable at the end near the strip contacts. The end of the extension cable remote from the flexible strip cable is wider than the flexible strip cable. A series of test traces are disposed on the extension cable. Each of the test traces is electrically connected to one of the strip traces, and has an electrical test contact near the end of the extension cable remote from the flexible strip cable. The minimum distance between two test contacts is greater than the minimum distance between two strip contacts.

In another embodiment of the invention, the test contacts are electrically accessible through one surface of the extension cable in any pattern such that the minimum distance between two test contacts is greater than the minimum distance between two strip contacts. In still another embodiment, at least one test contact is electrically accessible through one surface of the extension cable and at least one test contact is electrically accessible through the opposing surface of the extension cable.

In any of the above embodiments, a tooling guide may be attached to or integral with either the flexible strip cable or the extension cable such that a cutting tool may be aligned with the connection between the flexible strip cable or the extension cable.

BRIEF DESCRIPTION OF THE DRAWING

For a better understanding of these and other objects of the present invention, reference is made to the detailed description of the invention which is to be read in conjunction with the following drawings, wherein.

DESCRIPTION OF THE PREFERRED EMBODIMENT

Figure 1:
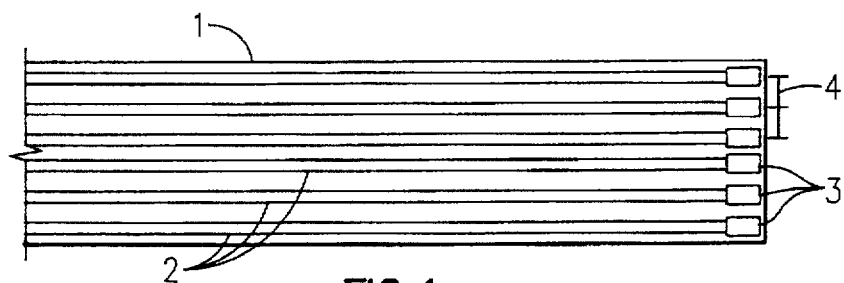
FIG. 1 is a generalized view of a flexible strip cable for use in an electronic device with the cover layer removed.

Referring to exemplary FIG. 1, there is shown an elongated flexible strip cable 1 for use in an electronic device. A series of strip traces 2 are disposed lengthwise on the flexible strip cable 1. The strip traces 2 carry electrical signals. The strip traces 2 have electrical strip contacts 3 at one end of the flexible strip cable 1. The strip contacts 3 may be exposed portions of the strip traces 2 which have an electrically conductive coating, such as tin or gold. In operation, a connector (not shown) fits over the end of the flexible strip cable 1, making electrical connection with the strip contacts 3.

There is a distance 4 measured between the centers of each of the strip contacts 3. The minimum such distance 4 is the strip trace pitch. The strip trace pitch may be on the order of 0.5 mm, or 20 mils. One application uses twenty-eight strip traces 2. The flexible strip cable 1 in that application would have a width of approximately 14 mm, or 0.56 inches.

Whenever possible in the following description, elements in one exemplary figure which are the same and serve the same function as elements in other exemplary figures are referenced by the same numeral.

Figure 2:
FIG. 2 is a side-sectional view of a flexible strip cable for use in an electronic device.

Referring to exemplary FIG. 2, there is shown a cross-sectional view of the elongated flexible strip cable 1. The flexible strip cable 1 comprises a base layer 5 made of any suitable flexible, non-conductive material. The strip traces 2 are formed on one flat surface of the base layer 5. The strip traces 2 may be made of any suitable conductive material, such as copper. The strip traces 2 may be individually laid down on the base layer 5, or a layer of conductive material may be laid down on the base layer 5 and the strip traces 2 may be photo-etched into the layer of conductive material. The strip traces 2 have strip contacts 3.

A cover layer 6 is then laid down over the strip traces 2. The cover layer 6 may be made of plastic, such as a polyimide. The strip contacts 3 may extend through the cover layer 6, as shown in exemplary FIG. 2, or may be covered by the cover layer 6. In the instance where the cover layer 6 covers the strip contacts 3, electrical connection is made with the strip contacts 3 by pins punching through the cover layer 6.

An optional ground layer 7 may be laid down on the other flat surface of the base layer 5. The ground layer 7 is made of any suitable electrically conductive material. The ground layer 7 may then be covered by a second cover layer (not shown). The ground layer 7 may be electrically accessed either by an opening in the second cover layer (not shown), by pins punching through the second cover layer (not shown), or by electrical contacts (not shown) extending from the ground layer 7 through the base layer 5 to a strip trace 2.

Figure 3:
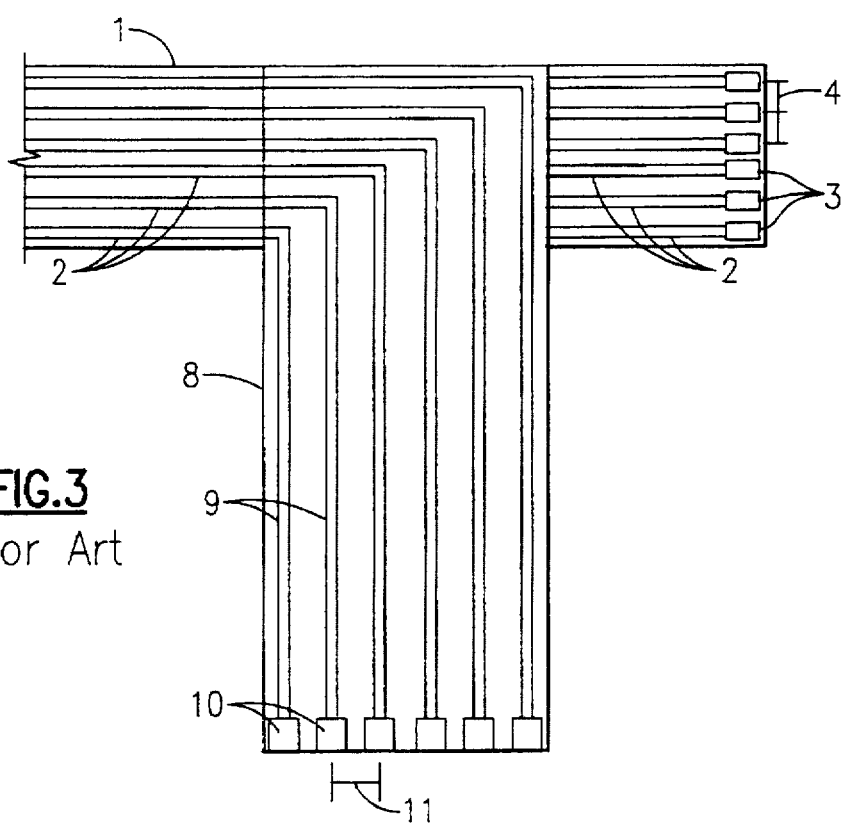
FIG. 3 is a generalized view of a prior art flexible strip test cable.

Referring to exemplary FIG. 3, there is shown a flexible strip cable 1 having a flexible strip test cable 8 attached thereon according to the prior art. The flexible strip test cable 8 may be made in the same manner and have the same structure as the flexible strip cable 1. The flexible strip test cable 8 is attached at one end to the flexible strip cable 1. The other end of the flexible strip test cable 8 may be flared.

On one surface of the flexible strip test cable 8 is a series of test traces 9, extending from the attached end to the flared end of the flexible strip test cable 8. The test traces 9 are electrically connected to the strip traces 2 at the attached end of the flexible strip test cable 8. The test traces 9 also have test contacts 10 at the flared end of the flexible strip test cable 8.

There is a distance 11 measured between the centers of each of the test contacts 10. The minimum such distance 11 is the test trace pitch. The test trace pitch is greater than the strip trace pitch, and may be on the order of 1.25 mm, or 50 mils.

A second embodiment of the flexible strip test cable 8 according to the prior art does not have a flared end. Instead, there are fewer test traces 9 than strip traces 2. These test traces 9 are electrically connected to certain strip traces 2 determined to be important for testing purposes. The test trace pitch in this embodiment is also greater than the strip trace pitch.

In each of the prior art embodiments, the flexible strip test cable 8 remains permanently attached to the flexible strip cable 1, even though the flexible strip test cable 8 is not used in the final electronic device. Additionally, the test traces 9 are electrically connected to the strip traces 2 at some point along the length of the strip traces 2, not at the ends of the strip traces 2. Therefore, a manufacturing fault in the strip traces 2 between the electrical connection to the test traces 9 and the strip contacts 3 will not be detected using the prior art flexible strip test cable 8.

Figure 4:
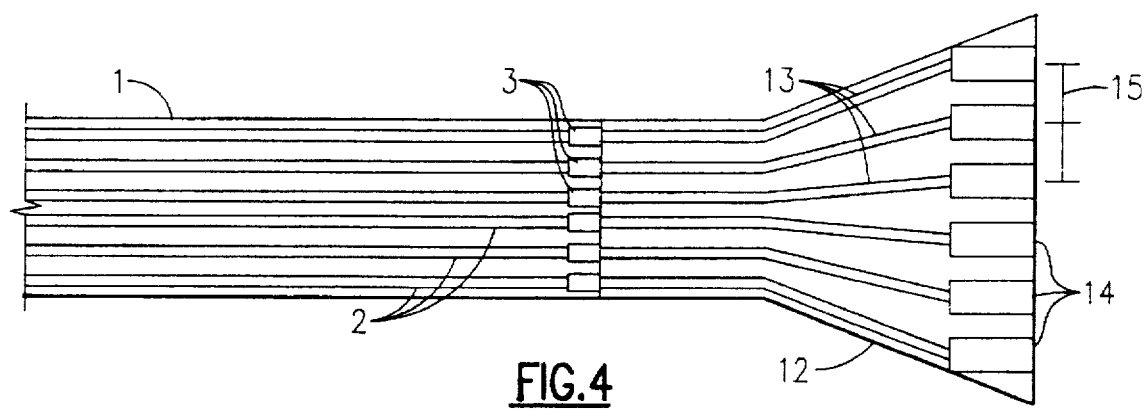
FIG. 4 is a generalized view of one embodiment of a flexible strip test cable according to the present invention.

Referring to exemplary FIG. 4, there is shown one embodiment of the invention. There is a flexible strip cable 1 having strip traces 2 with strip contacts 3. The minimum distance between two successive strip contacts 3 is the strip trace pitch. This strip trace pitch may be on the order of 0.5 mm, or approximately 20 mils.

A flexible strip test cable 12 has a first end which is attached to or integral with the flexible strip cable 1 near the strip contacts 3. A second end of the flexible strip test cable 12 is wider than the end of the flexible strip cable 1 near the strip contacts 3.

A series of test traces 13 extend from the first end to the second end of the flexible strip test cable 12. Each of the test traces 13 is electrically connected to one of the strip traces 2 near the strip contacts 3. Near the second end of the flexible strip test cable 12, the test traces 13 have test contacts 14. Similarly to the strip contacts 3 in the flexible strip cable 1, the test contacts 14 have an electrically conductive coating, such as tin or gold.

There is a distance 15 measured between the centers of each of the test contacts 14. The minimum such distance 15 is the test trace pitch. The test trace pitch is greater than the strip trace pitch, and may be on the order of 1.25 mm, or 50 mils.

The flexible strip test cable 12 may have a cover layer (not shown). The test contacts 14 may extend through the cover layer (not shown), or may be covered by the cover layer (not shown). In the instance where the cover layer (not shown) covers the test contacts 14, electrical connection is made with the test contacts 14 by pins punching through the cover layer (not shown).

In operation, electrical connection is made with the test contacts 14. Tests of the strip traces 2 are then made by testing the electrical signals carried through the strip traces 2 and the test traces 13 to the test contacts 14. After testing, the flexible strip test cable 12 is removed from the flexible strip cable 1.

Figure 5:
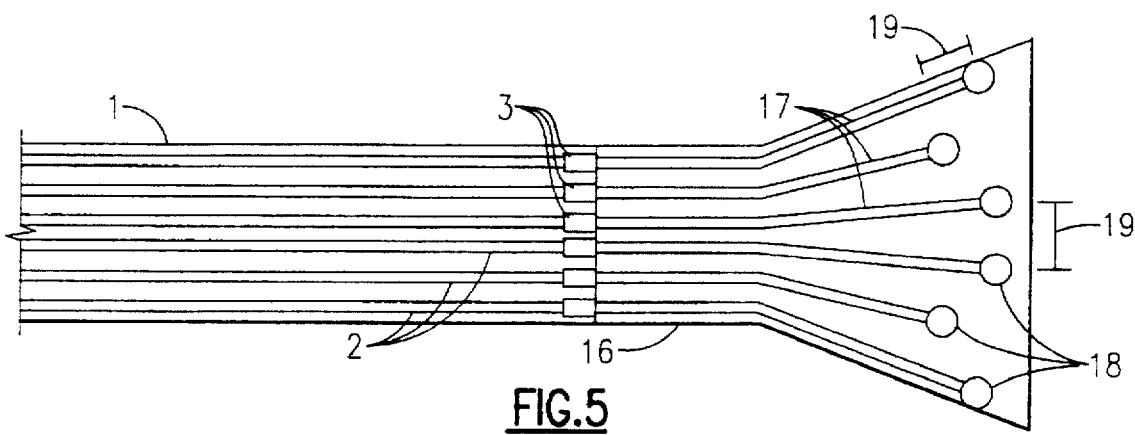
FIG. 5 is a generalized view of another embodiment of a flexible strip test cable according to the present invention.

Referring to exemplary FIG. 5, there is shown a second embodiment of the invention. There is a flexible strip cable 1 having strip traces 2 with strip contacts 3. The minimum distance between two successive strip contacts 3 is the strip trace pitch. This strip trace pitch may be on the order of 0.5 mm, or approximately 20 mils.

A flexible strip test cable 16 has a first end which is attached to or integral with the flexible strip cable 1 near the strip contacts 3. A second end of the flexible strip test cable 16 is wider than the end of the flexible strip cable 1 near the strip contacts 3.

A series of test traces 17 extend from the first end substantially toward the second end of the flexible strip test cable 16. Each of the test traces 17 is electrically connected to one of the strip traces 2 near the strip contacts 3. At the end of each test trace 17 remote from the flexible strip cable 16 is an electrically accessible point 18. Similarly to the strip contacts 3 in the flexible strip cable 1, the test contacts 18 have an electrically conductive coating, such as tin or gold.

The test contacts 18 are arranged in a pattern such that there is a distance 19 measured between the centers of each of the test contacts 18. The minimum such distance 19 is the test trace pitch. The test trace pitch is greater than the strip trace pitch, and may be on the order of 1.25 mm, or 50 mils.

The flexible strip test cable 16 may have a cover layer (not shown). The test contacts 18 may extend through the cover layer (not shown), or may be covered by the cover layer (not shown). In the instance where the cover layer (not shown) covers the test contacts 18, electrical connection is made with the test contacts 18 by pins punching through the cover layer (not shown).

In operation, electrical connection is made with the test contacts 18. Tests of the strip traces 2 are then made by testing the electrical signals carried through the strip traces 2 and the test traces 17 to the test contacts 18. After testing, the flexible strip test cable 16 is removed from the flexible strip cable 1.

Figure 6:
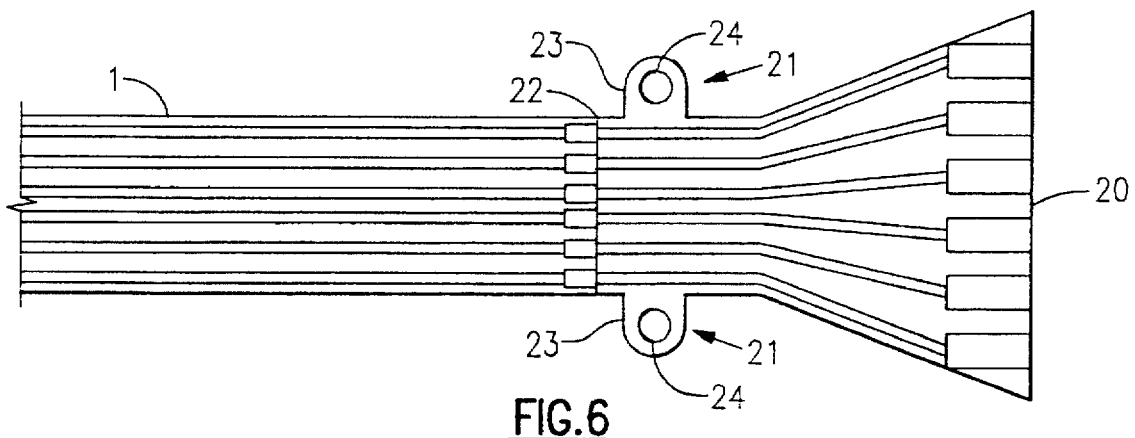
FIG. 6 is a generalized view of a flexible strip test cable having tooling guides.

Referring to exemplary FIG. 6, there is shown a flexible strip cable 1 with a flexible strip test cable 20. The flexible strip test cable 20 may be either the flexible strip test cable 12 or the flexible strip test cable 16. Tooling guides 21 are shown attached to or integral with the flexible strip test cable 20. There may be one or more tooling guides 21, and the tooling guides 21 may be attached to or integral with either the flexible strip test cable 20 or the flexible strip cable 1 or both.

The tooling guides 21 may be any configuration which allows a cutting tool (not shown) to align with the connection 22 between the flexible strip cable 1 and the flexible strip test cable 20, such that the cables 1, 20 may be severed or removed from each other at that connection 22. In the embodiment specifically shown in exemplary FIG. 6, the tooling guides 21 comprise a tab 23 having a tooling alignment hole 24. A guide pin (not shown) of the cutting tool (not shown) aligns within the tooling alignment hole 24. The guide pin (not shown) will be in fixed relationship with the blade (not shown) of the cutting tool (not shown), such that the blade (not shown) will be aligned with the connection 22.

It will be obvious to one skilled in the art that modifications to the above description of the invention may be made without departing from the spirit and scope of the invention. The scope of the invention, therefore, is indicated by the appended claims rather than the above description.

What is claimed is:

1. A flexible strip assembly with an extension for testing, said assembly comprising:
   an elongated flexible strip cable having a first end;
   a series of strip traces for carrying electrical current, said strip traces disposed lengthwise on said flexible strip cable, each of said strip traces having electrical strip contacts near said first end of said flexible strip cable, a minimum distance between two successive strip contacts defining a strip trace pitch;
   an extension cable having a first end and a second end, said extension cable being integral with said flexible strip cable, said first end of said extension cable being connected to said first end of said flexible strip cable, and said second end of said extension cable having a width greater than the width of said first end of said flexible strip cable;
   a series of test traces for carrying electrical current, said test traces extending from said first end of said extension cable to said second end of said extension cable, each of said test traces being electrically connected to one of said strip traces, each of said test traces having electrical test contacts near said second end of said extension cable, a minimum distance between two successive test contacts defining a test trace pitch, said test trace pitch being greater than said strip trace pitch; and
   a tooling guide in a fixed relationship with said first end of said flexible strip cable, said tooling guide for aligning a cutting tool with said first end of said flexible strip cable.

2. The flexible strip assembly according to claim 1 wherein said tooling guide is mounted to said extension cable.

3. The flexible strip assembly according to claim 1 wherein said tooling guide is integral with said extension cable.

4. A flexible strip assembly with an extension for testing, said assembly comprising:
   an elongated flexible strip cable having a first end;
   a series of strip traces for carrying electrical current, said strip traces disposed lengthwise on said flexible strip cable, each of said strip traces having electrical strip contacts near said first end of said flexible strip cable, a minimum distance between two successive strip contacts defining a strip trace pitch;
   an extension cable having a first end and a second end, said extension cable being integral with said flexible strip cable, said first end of said extension cable being connected to said first end of said flexible strip cable, and said second end of said extension cable having a width greater than the width of said first end of said flexible strip cable;
   a series of test traces for carrying electrical current, said test traces extending from said first end of said extension cable substantially toward said second end of said extension cable, each of said test traces being electrically connected to one of said strip traces, each of said test traces having electrical test contacts at an end remote from said strip traces, a minimum distance between two successive test contacts defining a test trace pitch, said test trace pitch being greater than said strip trace pitch: and
   a tooling guide in a fixed relationship with said first end of said flexible strip cable, for aligning a cutting tool with said first end of said flexible strip cable.

5. The flexible strip assembly according to claim 4 wherein said tooling guide is mounted to said extension cable.

6. The flexible strip assembly according to claim 4 wherein said tooling guide is integral with said extension cable.

7. The flexible strip assembly according to claim 4 wherein:
   said extension cable defines a top and a bottom, said top defining a plane;
   at least one of said test contacts is electrically accessible from said top of said extension cable;
   at least one of said test contacts is electrically accessible from said bottom of said extension cable; and
   said test trace pitch is measured parallel to said plane.

8. A flexible strip assembly with an extension for testing, said assembly comprising:
   an elongated flexible strip cable having a first end;
   a series of strip traces for carrying electrical current, said strip traces disposed lengthwise on said flexible strip cable, each of said strip traces having electrical strip contacts near said first end of said flexible strip cable, a minimum distance between two successive strip contacts defining a strip trace pitch;
   an extension cable having a first end and a second end, said extension cable being integral with said flexible strip cable, said first end of said extension cable being connected to said first end of said flexible strip cable, and said second end of said extension cable having a width greater than the width of said first end of said flexible strip cable;
   a tooling guide in a fixed relationship with said first end of said flexible strip cable, said tooling guide for aligning a cutting tool with said first end of said flexible strip cable; and
   a series of test traces for carrying electrical current, said test traces extending from said first end of said extension cable to said second end of said extension cable, each of said test traces being electrically connected to one of said strip traces, each of said test traces having a corresponding electrical test contact near said second end of said extension cable, a minimum distance between two adjacent test contacts defining a test trace pitch, said test trace pitch being greater than said strip trace pitch so that a test of said flexible strip cable may be readily made by connecting a test line to said test contacts, said extension cable thereafter being removable from said flexible strip cable for independent use thereof.

9. The flexible strip assembly according to claim 8 wherein said tooling guide is mounted to said extension cable.

10. The flexible strip assembly according to claim 8 wherein said tooling guide is integral with said extension cable.

11. The flexible strip assembly according to claim 8 wherein said extension cable is removed from said flexible strip by cutting along the connection between said first end of said extension cable and said first end of said flexible strip cable thereby placing said electrical strip contacts of said flexible strip cable in condition for a permanent connection.

12. A flexible strip assembly with an extension for testing, said assembly comprising:

an elongated flexible strip cable having a first end;

a series of strip traces for carrying electrical current, said strip traces disposed lengthwise on said flexible strip cable, each of said strip traces having an electrical strip contact near said first end of said flexible strip cable, a minimum distance between two successive strip contacts defining a strip trace pitch;

an extension cable having a first end and a second end, said extension cable being integral with said flexible strip cable, said first end of said extension cable being connected to said first end of said flexible strip cable, and said second end of said extension cable having a width greater than the width of said first end of said flexible strip cable;

guide means located in a fixed relationship with said first end of said flexible strip cable, said guide means for aligning a parting tool with said first end of said flexible strip cable; and a series of test traces for carrying electrical current, said test traces extending from said first end of said extension cable substantially toward said second end of said extension cable, each of said test traces being electrically connected to a corresponding one of said strip traces, each of said test traces having an electrical test contact at an end remote from said strip traces, a minimum distance between two successive test contacts defining a test trace pitch, said test trace pitch being greater than said strip trace pitch so that a test of said flexible strip cable may be readily made by connecting a test line to said test contacts, said extension cable thereafter being removable from said flexible strip cable for independent use thereof.

13. The flexible strip assembly according to claim 12 wherein said guide means is mounted to said extension cable.

14. The flexible strip assembly according to claim 12 wherein said guide means is integral with said extension cable.

15. The flexible strip assembly according to claim 12 wherein said extension cable is removed from said flexible strip by removing said extension cable from said flexible strip cable along said connection therebetween thereby placing said electrical strip contacts of said flexible strip cable in condition for a permanent connection.

16. The flexible strip assembly according to claim 1 wherein said extension cable is formed from a contiguous web-shaped member thereby allowing said test traces to expand away from each other as they extend from said first end of said extension cable toward said second end thereof.

17. The flexible strip assembly according to claim 4 wherein said extension cable is formed from a contiguous web-shaped member thereby allowing said test traces to expand away from each other as they extend from said first end of said extension cable toward said second end thereof.

18. The flexible strip assembly according to claim 8 wherein said extension cable is formed from a contiguous web-shaped member thereby allowing said test traces to expand away from each other as they extend from said first end of said extension cable toward said second end thereof.

19. The flexible strip assembly according to claim 12 wherein said extension cable is formed from a contiguous web-shaped member thereby allowing said test traces to expand away from each other as they extend from said first end of said extension cable toward said second end thereof.

* * * * *